United States Patent [19]

Compton

[11] Patent Number: 4,481,473
[45] Date of Patent: Nov. 6, 1984

[54] ELECTROMAGNET DROP TIME DETECTION METHOD

[75] Inventor: John I. Compton, Lexington, Ky.

[73] Assignee: International Business Machines Corporation, Armonk, N.Y.

[21] Appl. No.: 321,146

[22] Filed: Nov. 13, 1981

[51] Int. Cl.³ .................................................. G01R 31/02
[52] U.S. Cl. ....................................... 324/423; 324/420; 361/206
[58] Field of Search .................... 324/59, 73 AT, 415, 324/417, 418, 419, 420, 423; 361/206, 194, 195; 364/482, 483

[56] References Cited

U.S. PATENT DOCUMENTS

| | | | |
|---|---|---|---|
| 3,947,758 | 3/1976 | Sutton | 324/417 |
| 4,258,325 | 3/1981 | Richardson | 324/417 |
| 4,319,193 | 3/1982 | Boccali et al. | 324/418 |

Primary Examiner—Stewart J. Levy
Attorney, Agent, or Firm—Laurence R. Letson

[57] ABSTRACT

Electromagnetic actuator release characteristics are evaluated by sampling at high frequency the voltage waveform resulting when the magnet coil is deenergized. The samples are converted to a digitally coded form and stored in sequence. The stored values are then examined in reverse sequence to identify the first examined sampling interval in which the sample value exceeds a predetermined characteristic release level for the electromagnetic actuator. Finally, the release time is determined by calculating the time after energization corresponding to the sampling interval that has been identified as the release interval.

6 Claims, 4 Drawing Figures

ELECTROMAGNET DROP TIME DETECTION METHOD

BACKGROUND OF THE INVENTION

1. Technical Field of the Invention

The subject invention relates generally to diagnostic equipment for determining the quality of electromagnets and, more specifically, to diagnostic equipment for determining drop time for the armature of an electromagnetic actuator.

2. Art Discussion

In devices such as printers that are increasingly making use of electronic logic components, actuation decisions represented by electrical signals are often translated to mechanical motions by armatures driven by electromagnets. Where high speed operation is desired, electromagnet response characteristics become critical to correct operation, yet visual or tactile detection of out of specification performance is often impossible. Detection becomes especially difficult if a quality assessment is desired without removal from a larger mechanism, such as a printer.

To detect out of specification characteristics for electromagnetic actuators, it is known to use motion detectors relying on light beams or physical contact, but such detectors typically require removal of the actuator from a larger assembly. Measurement of the drive waveform for an electromagnet is known for determining drop time, but, typically, the overall waveform is either filtered to remove effects of oscillations or a point well beyond the oscillatory portion of the waveform is studied in detecting some measure of performance not directly correlated to drop time.

BRIEF SUMMARY OF THE INVENTION

The waveform produced on deenergization of an electromagnetic actuator is analyzed in reverse time order to identify a voltage level corresponding to armature release or drop. Initially, the waveform is repeatedly sampled over a period extending beyond an empirical worst case drop time, and the samples are stored in sequence. By accessing and analyzing the samples in reverse sequential order, the ringing that tends to mask the drop point is avoided. This avoidance is achieved without any need to closely estimate the time when ringing stops, and the well behaved decay associated with armature release has started.

As a further aspect of the invention, the magnet voltage is scaled and clipped to remain within the effective range of an analog-to-digital converter that is employed for sampling. The clip level is selected to remove only voltage spikes that occur during ringing and do not contain useful information regarding drop time.

BRIEF DESCRIPTION OF THE FIGURES

The invention will be described below with reference to the drawing wherein.

DETAILED DESCRIPTION REGARDING A PRESENTLY PREFERRED IMPLEMENTATION FOR THE INVENTION

Figure 1:
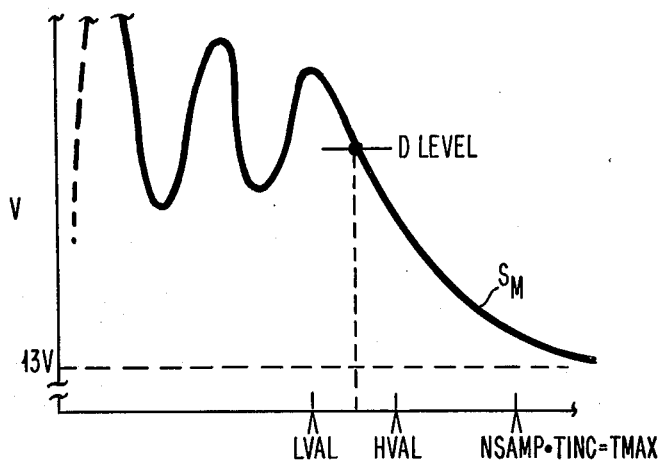
FIG. 1 is a diagrammatic representation of voltage waveform for an electromagnet when deenergized.
Figure 2:
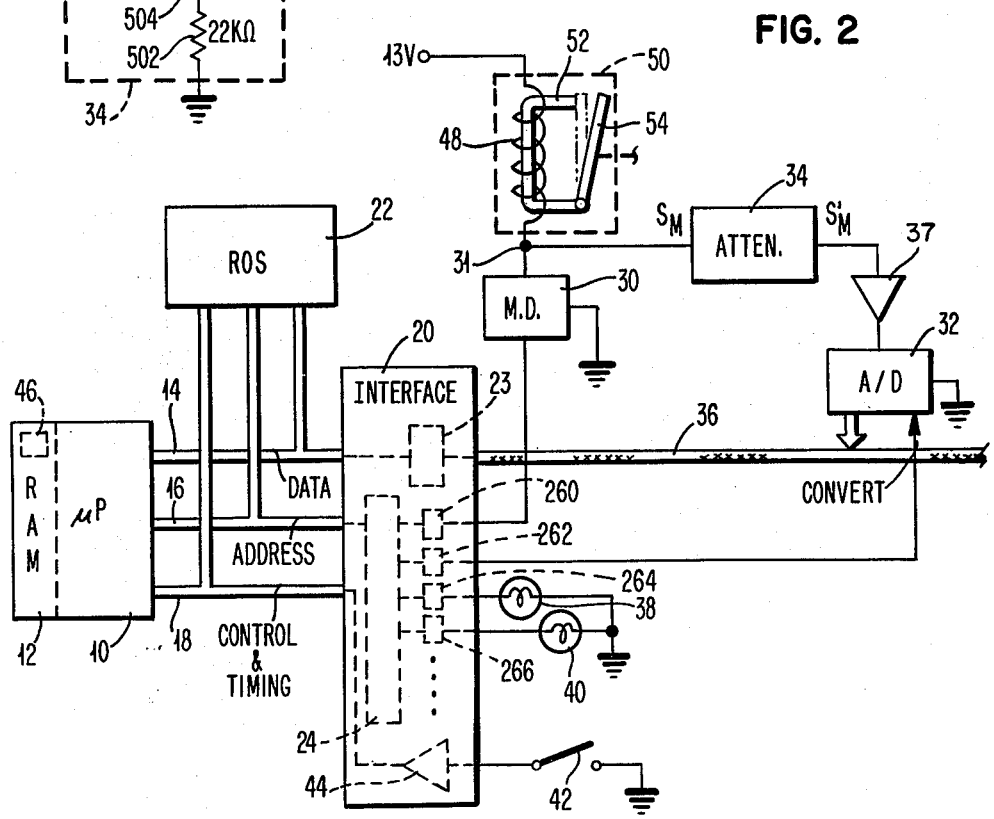
FIG. 2 is a diagram, namely in block form, representing a system for implementing the invention.

Referring to FIG. 1, a voltage waveform for deenergization of an electromagnetic actuator (see element 50, FIG. 2, discussed below) typically exhibits a period of ringing (transient oscillations) during which the voltage level oscillates unpredictably with a smooth decay occurring in the range where the armature (element 54, FIG. 2) separates from a core (element 52, FIG. 2). It has been found that for a specific design of electromagnetic actuator 50, the voltage at the instant the separation (or drop) occurs is essentially consistent, even the waveforms may vary widely and the voltage level (DLEVEL) for the drop may be achieved repeatedly during the transient oscillations that occur incident to deenergization. (A representative waveform is indicated in FIG. 1, but note that more or less severe ringing may occur and the tendency for ringing varies from device to device even assumming the same design and careful manufacturing.)

According to the invention, samples of the voltage waveform are repeatedly taken at high sampling frequency. No analysis is undertaken during sampling to avoid delay that would increase the sampling period (denoted TINC). Sampling occurs over a period of time that would, for a worst case, include the drop point (the time of armature separation). The samples, as is described below, are then analyzed in reverse time order to identify the drop point.

Referring to FIG. 2, a preferred diagnostic system for implementing the invention includes a processor 10 with a connected read/write storage section (RAM) 12. Connected to the processor 10 through data, address and control busses 14, 16 and 18, respectively, are an interfacing device 20 and a read-only-storage (ROS) 22 that is structured to include recallable processor instructions and constant data.

The interface device 20 serves to translate signals from a form compatable to the processor 10 to forms useful for various other devices (discussed below). Within the interface device 20 is a data register 23, an address decoder 24 and a set of latches including latches 260, 262, 264 and 266. The latch 260 is associated with a particular address A(1) by the decoder 24 and is connected to enable a magnet driver 30.

From the latch 262, signals are applied to the read/convert terminal of an analog-to-digital (A/D) converter 32. Data from the A/D converter 32 is applied to a data bus 36, in response to a pulse signal at the read/convert terminal, for transmission to the data register 23, this in response to an address signal A(2) at the decoder 24. The magnet driver 30 is connected to ground, when enabled, one side of a coil 48 of the electromagnetic actuator 50 to cause the armature 54 to move against the core 52 (as shown in phantom). From a node 31 connecting the magnet driver 30 to the coil 48, a magnet voltage signal $S_M$ is applied to an attenuator 34.

Figure 4:
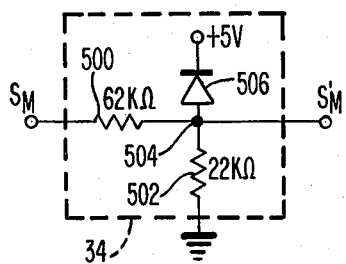
FIG. 4 is a schematic diagram of a signal attenuator.

The signal attenuator 34 (see FIG. 4) is preferably a resistor voltage divider including a resistor 500 which receives the signal $S_M$ and a resistor 502 which is connected to ground. At the node 504 between resistors 500 and 502, the attenuated signal $S'_M$ is produced. A diode 506 connected to a voltage source clamps the voltage at the node 504. The effect of the attenuator 34 is to scale the voltage $S_M$ to the conversion range of the A/D converter 32. By clamping the voltage $S'_M$ with the diode 506, voltage excursions during ringing that extend well above the drop voltage level are clipped for the attenuated voltage $S'_M$. The clip level is preferably chosen to be slightly above the value for the drop level DLEVEL as adjusted by the scaling factor imposed by the resistors 500 and 502. The effect of such attenuation is to increase voltage conversion accuracy without a loss of significant information.

The signal $S'_M$ after passing through the buffer amplifier 37 is applied to the A/D converter 32 which is connected to a data bus 36. Latches 264 and 266 are associated by the decoder 24 with specific addresses $A_4$ and $A_5$ and are connected to energize "good" and "bad" indicators 38 and 40, respectively. It is preferable for a printer environment, however, to merely store respective messages in the RAM 12 for selective automatic printout, as is a well known technique for providing diagnostic information.

To provide for an operator initiated signal to start a test sequence, a switch 42 is connected to control bus 18 through a buffer 44. In a printer, this switch 42 might be a keyboard switch or switch combination.

To determine the quality of individual electromagnetic actuators 50, the expected drop time voltage level DLEVEL is established by physical measurements on sample devices, for example, using optical detectors or mechanical detectors (not shown). For such benchmark tests, a lab environment may be used, but, it should be appreciated, that a special environment would not generally be required for the diagnostic tests according to the invention. Moreover, the lower limit (LVAL) on drop time and the upper limit (HVAL) which serve to specify the range of acceptable performance are predefined according to host system requirements prior to the diagnostic testing. A worst value for the drop time (TMAX) is also identified and is used in conjunction with the sampling period (TINC) established by the processor 10 to determine the number of samples (NSAMP) to be stored. A portion 46 of the RAM 12 that has sequential addresses identifiable with the index N is used for storing the samples.

Figure 3:
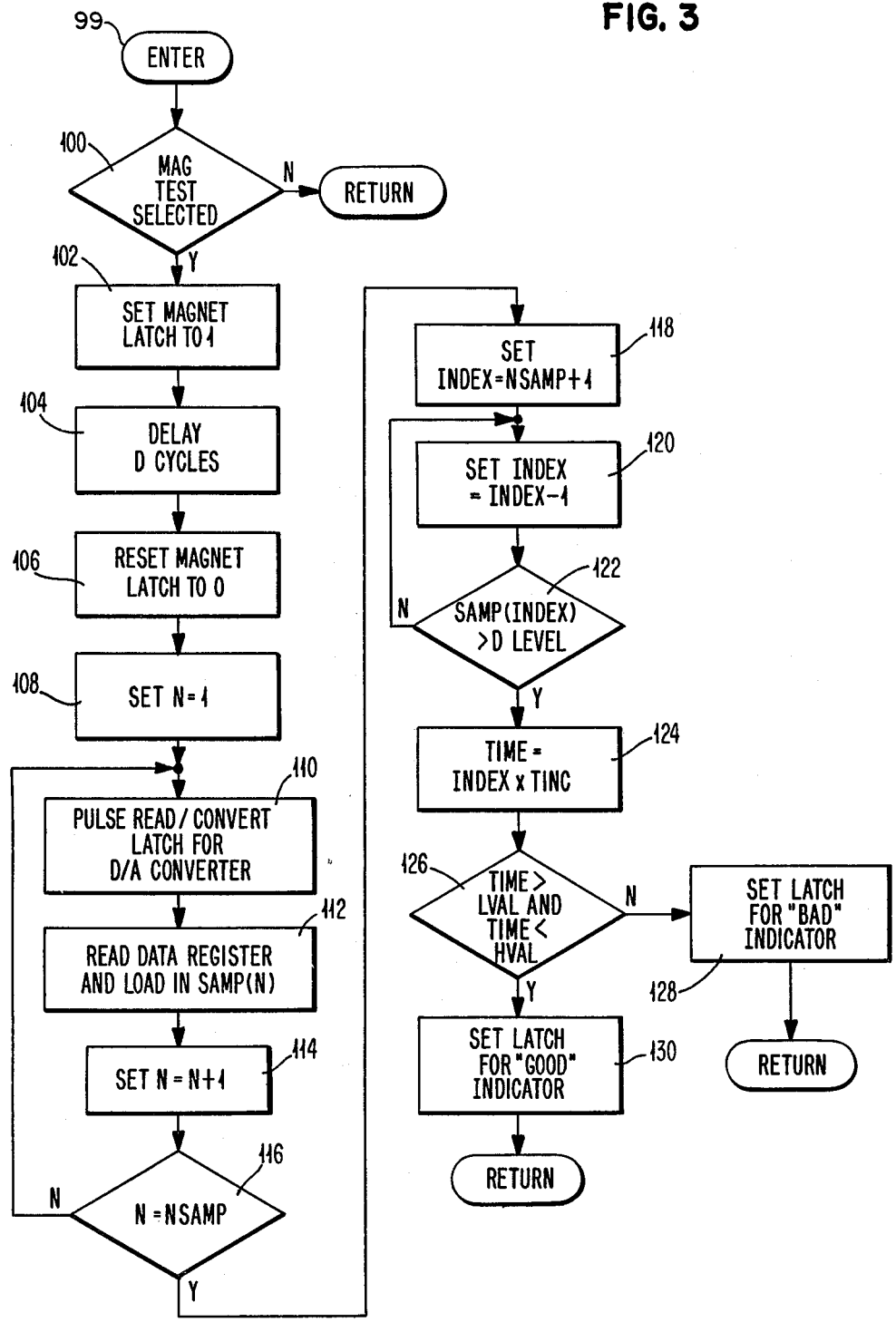
FIG. 3 is a diagram in the form of a flow chart for use in describing sequential logic for implementing the invention.

Referring to FIG. 3, logic for effecting the method of the invention is incorporated in the structures of the ROS 14 and the processor 10. The logic is entered (block 99), for example, from a polling loop as is a well known approach to prioritizing service requests to a processor such as the processor 10.

An initial decision construct (block 100) detects whether or not the switch 42 is closed to request a test sequence. If so, the latch 260 is set (block 102) to cause energization of the electromagnetic actuator 50 by magnet driver 30. The processor then idles in a loop (block 104) a predetermined number (D) of processor cycles which allows a full magnetic field buildup.

After the delay, the electromagnetic actuator 50 is deenergized by resetting (block 106) the latch 260. A sample index is set to 1 (block 108) to prepare for the taking of voltage samples and, in a loop including blocks 110 to 116, a preselected number (NSAMP) of sampling cycles are performed. At block 110, the latch 262 is pulsed to cause the A/D converter 32 to convert the incoming signal to digital form and place the digital code corresponding to the last sample on the data bus 36. The data register 23 is then read to provide sample values which are stored sequentially in a section 46 of the RAM 12. Indirect referencing is indicated using the variable name SAMP subscripted by the indexing variable N. The indexing variable N is incremented (block 114) for each pass through the loop and an exit is achieved when a predetermined number (NSAMP) of passes is completed (block 116).

With the sampling completed, a further indexing variable (INDEX) is initialized (block 118) relative to the number of samples and a loop is entered (blocks 120 and 122) for examining the samples in reverse sequence to locate the first to exceed the empirical drop voltage level (DLEVEL). The index variable INDEX, upon exiting the loop from block 122, indicates the sample for which the relationship relative to DLEVEL shifts and the test of block 122 is satisfied.

The time (TIME) for the identified sample is determined by multiplying the index number for the identified sample by the sample period TINC (block 124). The release time TIME is then compared (block 126) with a predefined set of acceptable range extremes (LVAL and HVAL) to determine whether or not the electromagnetic actuator 50 is out of specification. If out of specification, an operator perceivable indication is provided, for example, by actuating (block 128) the indicator 40. For a satisfactory test at block 126, the indicator 38 is actuated (block 130). As was mentioned above, for detection performed in a host printer (not shown), the printer is preferably activated by the test logic to indicate the test results for block 126 by selectively printing appropriate messages that are stored in the ROS 22 (FIG. 2).

The invention has been described with reference to a presently preferred implementation thereof. It will be appreciated that variations and modifications within the scope of the claimed invention will be suggested to those skilled in the art.

What is claimed is:

1. A method for evaluating the release characteristics of an electromagnet having an armature biased to a first position and moveable to a second position responsive to electrical potential applied across a coil of said electromagnet, said method comprising:

connecting said coil with an electrical potential thereacross to move said armature to said second position;

disconnecting said coil from said electrical potential while said armature is at said second position;

supplying a test voltage related to the potential difference appearing across said coil to an analog-to-digital converter;

sampling said test voltage with said analog-to-digital converter at regular intervals to produce a series of digital signals indicative of the instantaneous voltage waveform across said coil;

storing said samples sequentially in a data storage device for a time period preselected to exceed the maximum expected release time for said electromagnet;

examining the stored samples from said storage device in reverse sequential order to identify a sample that indicates a magnitude shift relative to a predefined voltage level corresponding to a release of said armature to said first position; and establishing a release time for said electromagnet based on the position of said identified sample in said sequence of samples.

2. A method according to claim 1 further including the steps of comparing said release time with a predefined acceptable range of release times and actuating an operator perceivable indicator of performance relative to said range of release times.

3. A method according to claim 1 wherein said step of supplying a test voltage includes the step of attenuating said potential difference to produce said test voltage.

4. A method according to claim 3 wherein said step of attenuating includes the steps of scaling and clipping said potential difference to range within the conversion range of said analog-to-digital converter.

5. A method according to claim 2 wherein said step of supplying a test voltage includes the step of attenuating said potential difference to produce said test voltage.

6. A method according to claim 5 wherein said step of attenuating includes the steps of scaling and clipping said potential difference to range within the conversion range of said analog-to-digital converter.

* * * * *